United States Patent [19]

Thorne

[11] 4,058,756
[45] Nov. 15, 1977

[54] BIDIRECTIONAL CHANNEL SKIPPING TUNER DRIVE SYSTEM WITH SINGLE POLE PROGRAMMING SWITCH

[75] Inventor: Richard L. Thorne, Elgin, Ill.

[73] Assignee: Zenith Radio Corporation, Glenview, Ill.

[21] Appl. No.: 664,139

[22] Filed: Mar. 5, 1976

[51] Int. Cl.² ............................................. G05B 11/01
[52] U.S. Cl. .................................... 318/265; 318/467
[58] Field of Search ............................... 318/265, 467

[56] References Cited

U.S. PATENT DOCUMENTS

| 2,989,679 | 6/1961 | Guzskie | 318/265 X |
| 3,790,956 | 2/1974 | Ichikawa et al. | 318/467 X |
| 3,796,938 | 3/1974 | Funston | 318/467 |
| 3,831,074 | 8/1974 | Smalser | 318/265 |

Primary Examiner—Robert K. Schaefer
Assistant Examiner—W. E. Duncanson, Jr.
Attorney, Agent, or Firm—Nicholas A. Camasto; Roy A. Ekstrand

[57] ABSTRACT

A television tuner drive system includes a bidirectional electric motor coupled to a rotatable channel selector. A carryover cam and switch coupled to the motor causes the motor power to be decoupled at each broadcast channel position. A plurality of cams are supported by a rotating drum coupled to the channel selector and coact with a cam follower and single pole switch to override the carryover switch and maintain power coupling to the motor. The drum-supported cams are positionable to selectively coact or clear the cam follower permitting programming of channel stop positions.

6 Claims, 4 Drawing Figures

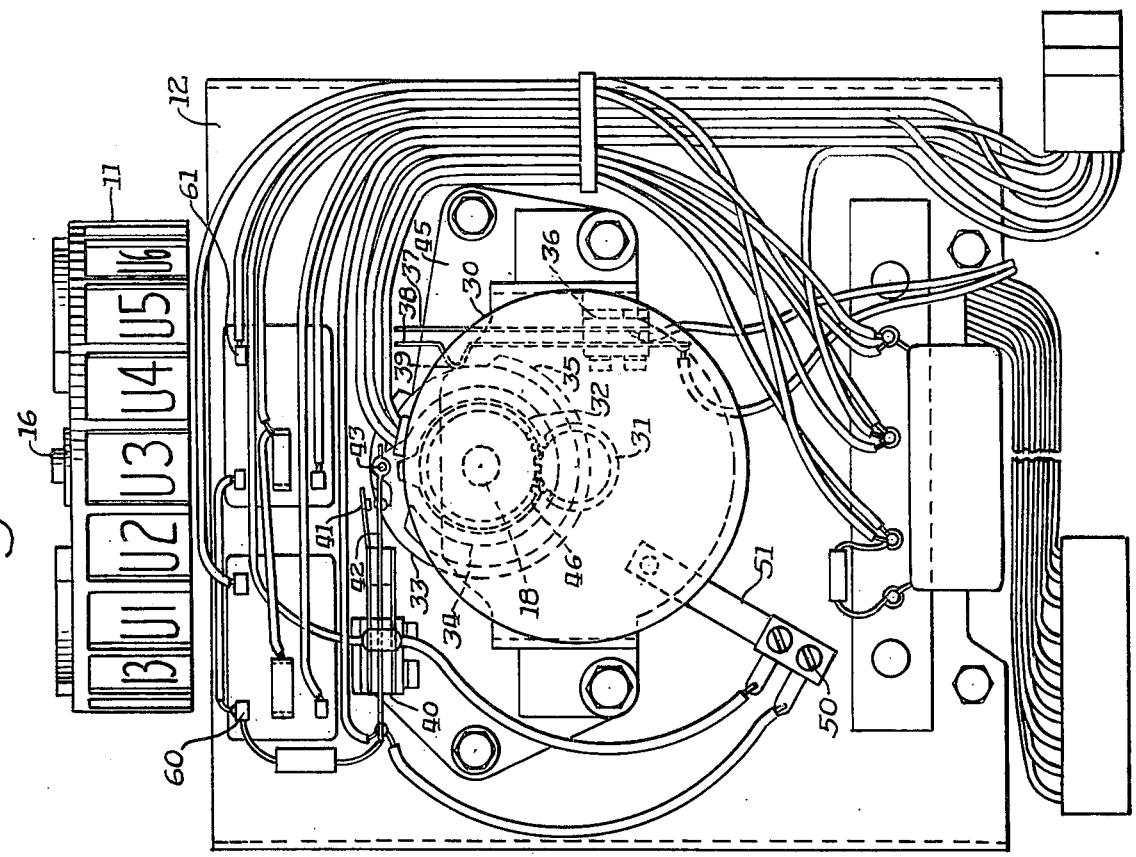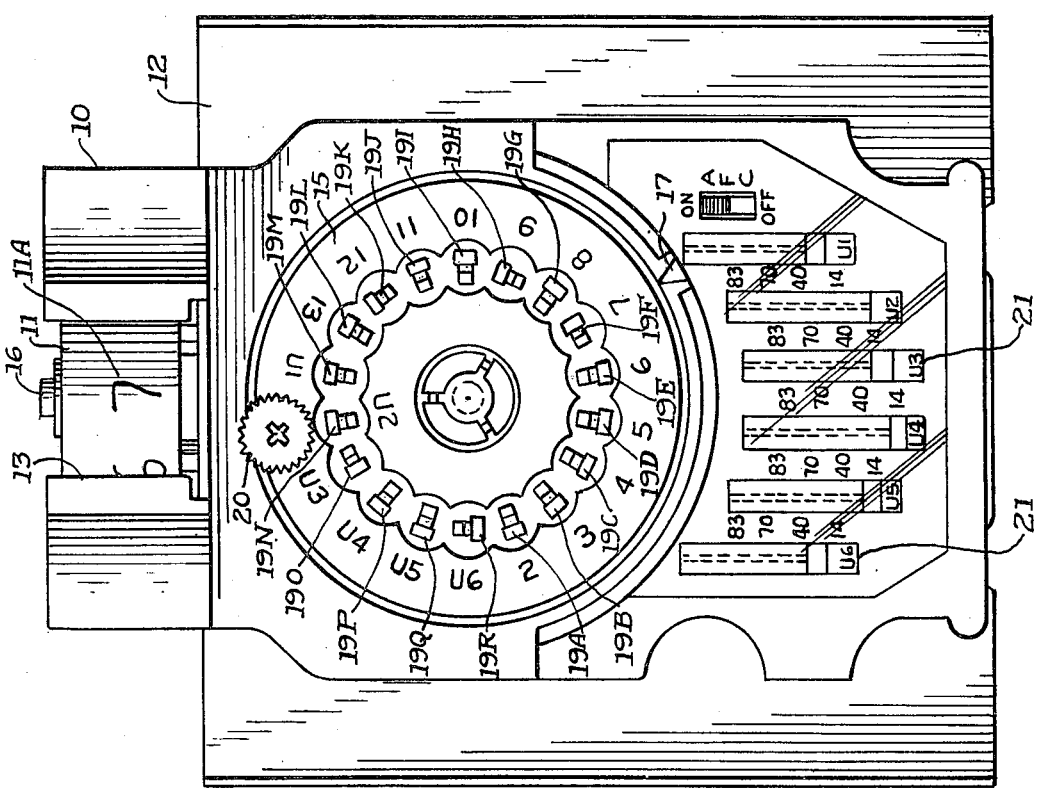

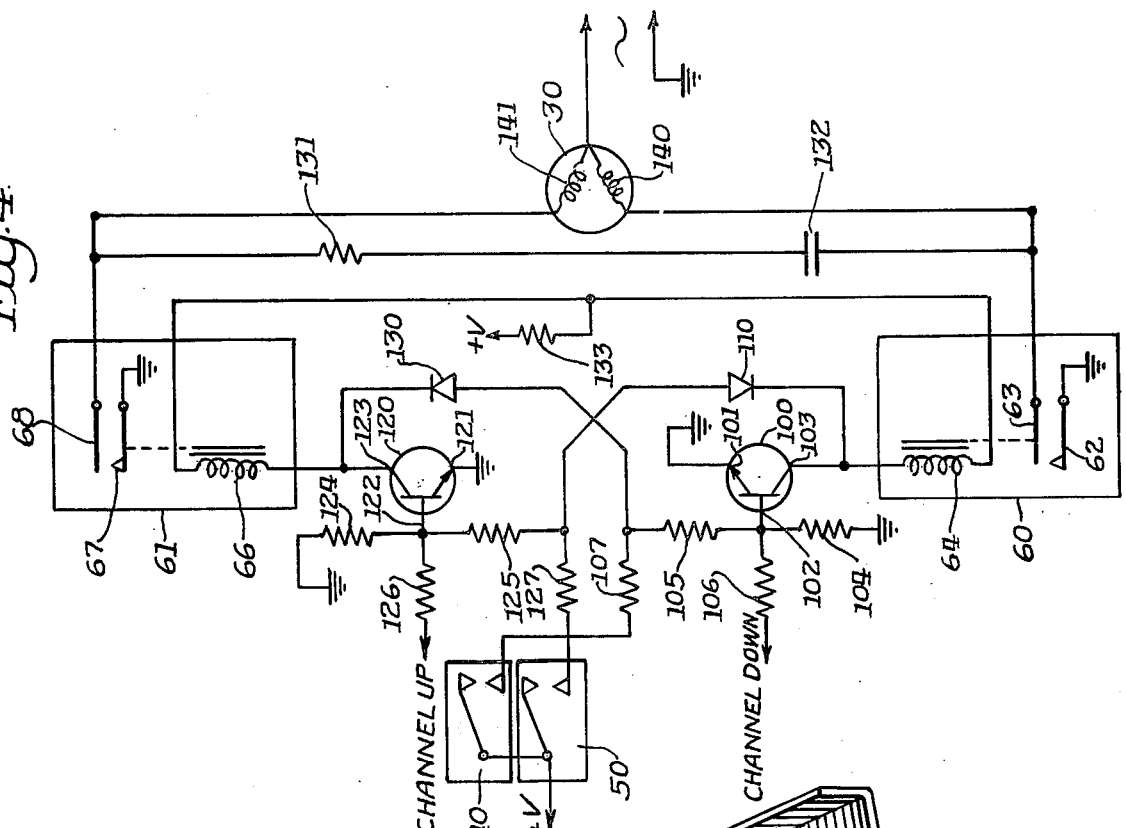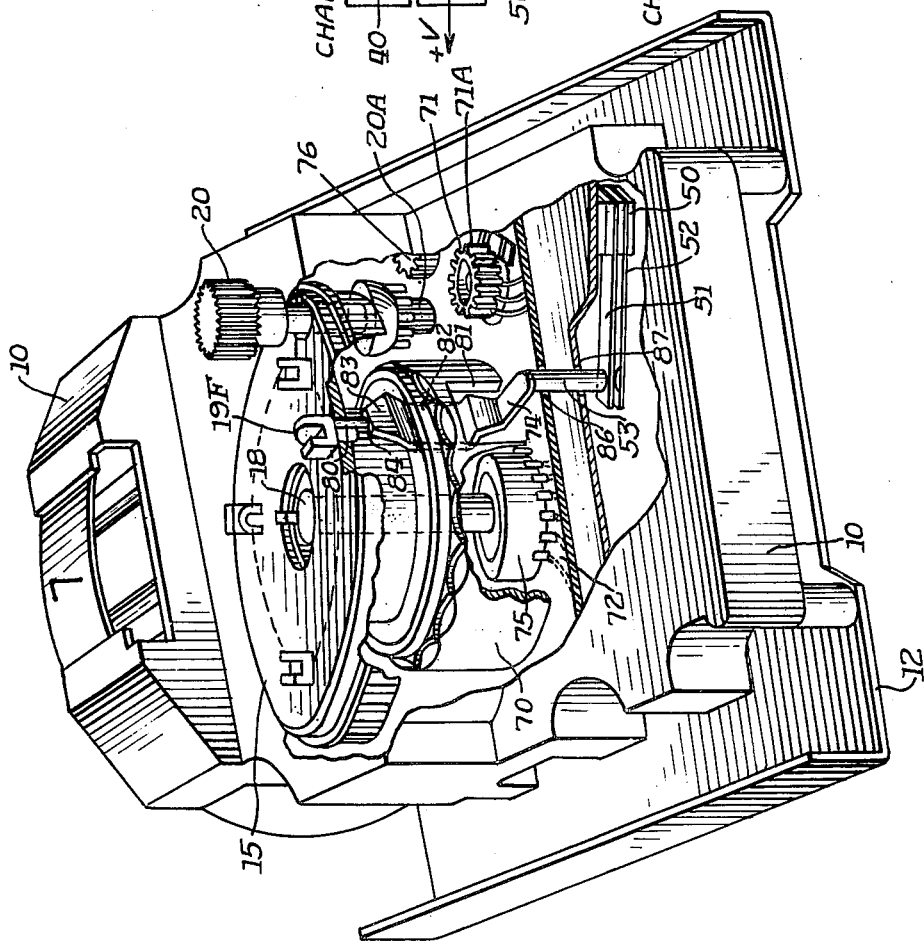

BIDIRECTIONAL CHANNEL SKIPPING TUNER DRIVE SYSTEM WITH SINGLE POLE PROGRAMMING SWITCH

BACKGROUND OF THE INVENTION

This invention relates generally to television motor driven tuner systems and more particularly to those incorporating programmable channel selection.

In a typical television receiver having a remote control system, a viewer actuated transmitter produces a command signal which operates circuitry within the television producing a "channel-up" or "channel-down" initiate command. Responsive circuitry within the receiver activates a motor which drives the channel selector to the next position. In general, system operation allows either channel-by-channel selection or a programmed skip sequence. In the former individual viewer commands are necessary to move the selector between each channel position while in the latter a programming mechanism selects certain channels which are "skipped over" by the channel selector. For example, in a typical reception area having operative broadcast stations assigned to channels 2, 5, 7 and 9, channel-by-channel operation would require three commands to move the selector from channel 2 to the next higher operative channel 5. In contrast a programmed system operation would cause the selector to go directly from channel 2 to 5 in response to a single command. Similarly, once tuned to channel 5 a channel-up command would move the system directly to channel 7 skipping the vacant channel 6 and so on.

Typical systems for programmed channel skipping use mechanical arrangements which in general comprise a bidirectional electric motor operable in a selected direction by the use of individual relays. Initiate means cause the motor to start rotation in the desired direction. A carryover mechanism comprising a cam coupled to the motor and switch maintain the appropriate relay connection once channel selector rotation has been initiated until the next channel is reached at which point the carryover switch opens. In the absence of a skip action the selector stops and another initiate command is required for further movement.

In most mechanical systems, a toggle switch coupled to the motor is set in the appropriate direction by the initial rotation of the motor. Programmed operation of such a system overrides the channel-by-channel carryover using the mechanically toggled switch and a program skip switch. The skip switch is actuated by cams which may be positioned to provide an alternate motor relay connection during the inactive time of the carryover. The system then simply "rides through" the channel and goes on. The function of the toggle switch is to indicate the motor direction to be maintained. While providing satisfactory operation, such systems exhibit difficulties of limited access to the programming mechanism and impose restraints upon the mechanical configurations which may be employed often frustrating aesthetic and viewer convenience aspects of receiver design.

The subsequently developing electronic systems generally utilize a similar bidirectional motor controlled by a pair of triacs which supply power to the appropriate motor windings to effect rotation in the desired direction. The triacs are controlled by electronic latching circuitry responsive to the channel-up or channel-down viewer commands. Programming is achieved by mechanically operative cams associated with the channel selector which may be positioned to interrupt motor rotation at desired channels. Such circuits generally include complex latch release circuitry to accomplish this function rather than simple switching arrangements which characterize the earlier mechanical systems. While performing satisfactorily and providing significant advantages in design flexibility over earlier mechanical systems, such electronic systems are relatively complex and costly.

OBJECTS OF THE INVENTION

It is an object of the present invention to provide an improved, low cost, motor driven tuner system for a television receiver.

It is a further object to provide an improved, low cost, motor driven tuner system having increased flexibility of design.

SUMMARY OF THE INVENTION

A tuner drive system for use in a television tuning system in which a tuner channel selector is rotatable between a plurality of positions each corresponding to a broadcast channel, includes a bidirectional electric motor, means mechanically coupling the motor and channel selector, initiate means responsive to viewer commands initiating channel selector rotation in a selected direction, carryover means activated by channel selector rotation for continuing said rotation in the selected direction until the next broadcast channel position is reached inactivating the carryover means. Skip means, mechanically coupled to the channel selector are operative before the carryover means become inactivated causing the channel selector to pass through selected ones of the plurality of broadcast channel positions without stopping, and comprise a single pole nondirection sensing switch, a plurality of camming means associated with each of the broadcast channel positions selectively positionable to engage the switch, and electrical latching means, responsive to the initiate means and switch, maintaining channel selector rotation in the selected direction during the inactive period of the carryover means.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 1 is a frontal view of a tuner drive system constructed in accordance with the present invention;

FIG. 2 is a view of the reverse side of a tuner drive system constructed in accordance with the present invention;

FIG. 3 is a partially sectioned perspective view of the present invention tuner drive system; and FIG. 4 is a schematic detail of the motor control circuitry of the present invention tuner drive system.

DESCRIPTION OF THE PREFERRED EMBODIMENT

FIG. 1 shows a tuner drive system constructed in accordance with the present invention. A substantially flat metal frame 12 supports a molded housing 10 which defines apertures 14 and 13. A rotatable drum 15 supported by a shaft 18 bears a plurality of programming cams 19A through 19R inclusive and an adjusting wheel 10. A second rotatable drum 11 is supported by a shaft 16 which is mechanically coupled to drum 15. Drum 11 bears a plurality of channel number designations such as 11A which are visible through aperture 13. Housing 10 also defines an index pointer 17.

FIG. 1 depicts the "front" portion of the tuner drive system as normally seen by the viewer when the tuner is installed in a typical television receiver cabinet. During operation an electric motor (not shown) simultaneously rotates drums 11 and 15 and a channel selector switch (also not shown) in response to viewer initiated channel-up or channel-down commands. Drums 11 and 15 and the channel selector switch are detented at positions corresponding to broadcast channels. In addition to channel selection, each detent position of drum 15 aligns adjusting wheel 20 with an appropriate potentiometer (not shown) to facilitate a fine tuning or preset adjustment of each channel by means described below in greater detail.

System operation may be programmed to skip or pass selected channels by selectively positioning appropriate ones of cams 19A through 19R. In the figure shown cams 19F, 19R, 19O, 19K and 19H are shown in the stop position while the remaining cams are positioned to provide channel skipping. As a result the system shown will stop at channels U6, U3, 9 and 12 and skip all others. In accordance with an important advantage of the present invention, it should be noted that cams 19A through 19R remain readily accessible to the viewer when the unit is installed in a cabinet allowing easy programming.

FIG. 2 shows the "reverse" side of the tuner drive system of the present invention. An electric motor 30 is supported by a generally "U" shaped metal bracket 45 and is coupled via a drive gear 31 to a driven gear 46 which, in turn, is coupled to drum 15 by shaft 18. A multiple surface cam 33 is coupled to shaft 18 and defines cam surfaces 34 and 35. Each complete rotation of cam 33 corresponds to a movement of one channel position for drums 15 and 11.

A carryover switch 40 includes a pair of contact arms 41 and 42. The latter also supports a cam follower 43 which is cammed by the action of cam surface 34. An AFC muting switch 36 includes a pair of contact arms 37 and 38. Contact arm 38 also defines a cam follower 39. A skip switch 50 includes a contact arm 51 and a second contact arm 52 directly beneath arm 51 (not shown). The operation of skip switch 50 will be described below.

The operation of the present system is best understood by ignoring for the moment the programmed channel skipping operating and considering only channel-by-channel operation. A channel-up or channel-down initiate command causes momentary closure of the appropriate one of relays 60 or 61 which, in turn, activates motor 30. The initial rotation of cam 33 during this command response causes cam follower 43 to abut surface 34 closing contacts 41 and 42. After closure of contacts 41 and 42 the initiate command is no longer needed and carryover switch 40 and cam 33 maintain relay energizing.

Contacts 41 and 42 remain closed during the subsequent rotation of cam 33 and open again when the cam returns to its initial position which corresponds to the next channel detent position. With the opening of contacts 41 and 42, relay energizing ceases and the power coupling to motor 30 is interrupted and the system stops. At the next channel-up or channel-down command the appropriate relay is again energized momentarily moving cam 33 and causing closure of contacts 41 and 42 during another revolution of cam 33. With the return of cam 33 to the initial position, contacts 41 and 42 are again opened and the system again rests.

Simply stated then, channel-by-channel operation of the system provides that an initiate command causes a momentary energizing of a motor relay. Sufficient rotation of cam 33 results from the initiate command to close carryover switch 40 maintaining motor activation during one complete cam revolution and deactivating the motor at the next channel position.

It should also be noted that during the rotation of cam 33, cam follower 39 of AFC mute switch 36 is moved by cam surface 36 to cause closure of contacts 37 and 38. This closure does not take part in the drive operation but rather provides the well known AFC mute action in which the automatic frequency control (AFC) of the receiver is rendered inoperable during the channel switching process.

With this brief explanation of channel-by-channel operation, programmed operation may now be described by reference to FIG. 3 which shows a partially sectioned perspective view of a portion of the present invention tuning system. For purposes of clarity the numerous electric connections and wires shown in FIG. 2 have been omitted. A printed circuit board 72 supports a plurality of potentiometers in circular arrangement concentric with shaft 18. Potentiometers 71 and 76 are representative of these potentiometers. It should be understood, however, that their total number would correspond to the number of channel positions. An 18 position rotary switch 75 is supported by circuit board 72 and is mechanically coupled to motor shaft 18. A cylindrical molded housing 70 is supported by printed circuit board 72 and positioned concentrically with shaft 18. Housing 70 defines an aperture 81 and an internal channel 82. A substantially "L" shaped cam follower 83 is captivated within channel 82 and moves vertically therein. An upper cam surface 84 and a lower extension arm 74 are formed on cam follower 83. A plunger 53 passes through a pair of apertures 86 and 87 defined in printed circuit board 72 and steel frame 12, respectively, and is retained between contact arm 51 and extension arm 74. Drum 70 and cam follower 83 do not, of course, rotate.

The underside of printed circuit board 72 includes conventional printed circuit foil patterns (shown by dashed lines) making appropriate electrical connections between the concentrically disposed potentiometers (illustrated by 71 and 76), the connections of channel selector switch 75, and a conventional varactor tuner (not shown). In the system shown the function of switch 75 is to selectively apply the appropriate tuning voltage to a varactor tuner which by well known circuit techniques establishes channel reception by application of an appropriate voltage to a tunable varactor diode network.

In operation the rotation of drums 15 and 11 in response to motor 30 also rotates selector switch 75 such that at each detent channel position the appropriate connections are made to the varactor tuner. The operation of channel selection via switching voltages to the varactor tuner is essentially conventional and need not be described further. In addition, it should be obvious that a mechanically operated tuner rather than a varactor type may be used without departing from the spirit of the present invention. In such case, the mechanical rotor of the tuner would be driven in a similar place and manner to that shown for selector switch 75.

The programmed channel selecting operation of the present system is accomplished by selective orientation of cams 19A through 19R inclusive. Orientation of the cams is accomplished by a 90° rotation which causes an off center appendage 80 to selectively abut or "clear" surface 84 of cam follower 83 as drum 15 rotates in response to the electrical motor. At channel positions for which the cam has been oriented in a skip position cam appendage 80 contacts cam surface 84 causing cam follower 83 to move downward imparting a force coupled through extension 74 which causes plunger 53 to close contact arms 51 and 52 of switch 50. The closure of switch contacts 51 and 52, in turn, causes the motor to continue operating in the existing direction by operation explained later in greater detail. However, it should at this point be noted that the duration of switch closure is determined by the width of cam surface 84.

If, on the other hand, the cam is oriented such that cam appendage 80 does not contact surface 84 of cam follower 83 (i.e., by a 90° rotation) no motion is imparted to plunger 53 as drum 15 rotates and contacts 51 and 52 of skip switch 50 remain open. Under such condition the normal operation described above of the carryover switch will interrupt the motor rotation after one complete revolution of cam 33 and the system will stop. Thus in the instance shown in FIG. 2 the system will stop at each channel position with the exception of the 90° oriented cams 19F, 19R, 19O, 19K and 19H.

As mentioned above tuning adjustment of each channel position is facilitated by adjusting wheel 20. A downward pressure on the adjusting wheel brings gear 20A into mesh with a gear surface 71A of potentiometer 71. Rotation of adjusting wheel 20 while depressed alters the setting of potentiometer 71. It should be apparent that the travel of adjusting wheel 70 during the rotation of drum 15 brings it into alignment with each of the concentrically disposed potentiometers at the various detent positions facilitating their adjustment.

FIG. 4 shows a schematic representation of the electronic latch and motor control of the present invention tuning system. A transistor 100 has an emitter 101 connected to ground, a base 102 coupled to ground by a resistor 104 and a collector 103 connected to one end of a relay energizing winding 64 of relay 60. A series combination of resistors 105 and 107 couples base 102 to one contact of skip switch 50. Base 102 is also coupled by a resistor 106 to a source of channel-down command voltage. A second transistor 120 has an emitter 121 connected to ground, a base 122 coupled to ground by a resistor 124 and a collector 123 connected to one end of a relay energizing winding 66 of relay 61. A series combination of resistors 125 and 127 couples base 122 to one contact of skip switch 50. A resistor 126 couples base 122 to a source of channel-up command voltage. The remaining ends of energizing windings 64 and 66 of relays 60 and 61 are commonly connected to a source of positive voltage +V by a resistor 133.

A diode 110 has an anode connected to the junction of resistors 125 and 127 and a cathode connected to collector 103. A second diode 130 has an anode connected to the junction of resistors 107 and 105 and a cathode connected to collector 123. A pair of relay contacts 62 and 63 of relay 60 are connected to ground and to a winding 140 within motor 30, respectively. A pair of relay contacts 67 and 68 of relay 61 are connected to ground and to a motor winding 141 of motor 30. Windings 140 and 141 are connected in series with their center junction connected to a source of alternating current power. A phase shift network comprising the series combination of a resistor 131 and a capacitor 132 is connected in parallel with the series combination windings 140 and 141.

Before describing the operation of the circuit shown in FIG. 4, a summary of the relative closure times for skip switch 50 and carryover switch 40 is believed helpful. As mentioned above, carryover switch 40 is closed after the initiate command and remains closed until the next detent channel position is reached. Skip switch 50 will either remain open through the entire cycle in the event the system is programmed to stop at the next channel or close shortly before the opening of carryover switch 40 and remain closed until after the carryover switch has again closed in the event of a skipped channel.

Circuit operation is best understood if the system is assumed intially at rest, that is, both switches open, for example, when a channel-up initiate command is received a positive voltage is momentarily applied to base 122 of transistor 120 turning it on and causing it to saturate. With transistor 120 in saturation, current flows through energizing winding 66 and relay 61 causing motor 30 to start rotation.

The direction of rotation is determined by the phase relationship between the currents in windings 140 and 141. In the case of a channel-up rotation winding 141 is coupled directly to ground by the closure of contacts 67 and 68 while winding 140 is coupled to ground via phase shift capacitor 132 and resistor 131. Once motor 30 begins rotation carryover switch 40 is caused to close by the above-described camming action, coupling a positive voltage via switch 40 to the two resistive dividers formed by resistors 127, 125 and 124 and by resistors 107, 105 and 104. Because transistor 120 is in saturation grounding the cathode of diode 130, the potential present at the junctions of resistors 107 and 105 causes it to conduct essentially grounding the junction of resistors 107 and 105 and preventing any positive voltage from being coupled to base 102. As a result transistor 100 remains cut off.

In contrast, cut off transistor 100 does not ground the cathode of diode 110 and it remains nonconductive. The positive voltage applied to resistors 127, 125 and 124 maintains saturation of transistor 120. As a result the circuit is then "latched" with transistor 120 conduction energizing relay 61 to the exclusion of transistor 100 and relay 60.

As the next detent position is reached, carryover switch 40 will, of course, open and if skip switch 50 is not programmed to close, the positive voltage at base 122 of transistor 120 will be interrupted and the system will stop. In contrast, if the system is programmed to skip the next channel position, switch 50 will close before the opening of carryover switch 40 and remain closed maintaining the supply of positive voltage to transistor 120 until after carryover switch 40 has again closed. The system then continues to run in the selected direction until the next programmed stop is arrived at when both the skip and carryover switches are simultaneously open.

A similar operation, of course, occurs in the event of a channel-down command in which transistor 100 will conduct causing current to flow in winding 64 energizing relay 60 and reversing the phase relationship between windings 140 and 141. The motor will operate in the reverse direction again closing carryover switch 40. With closure of switch 40, transistor 100 will remain saturated turning on diode 110 and causing transistor 120 to remain nonconductive.

The circuit function, therefore, is to latch in the appropriate output configuration and maintain closure of the appropriate relay to continue motor and channel selector rotation in the desired direction until the next programmed stop position is reached. It is important to note that this novel arrangement permits the use of a nondirectional, single pole, single throw switch for the carryover function as well as for the skip switch function. The existing direction of motor rotation at the time that the carryover function drops out is automatically maintained during the activity of the skip function. This is accomplished without the relatively complex latch release circuits used in the prior art circuitry while still maintaining the desired flexibility not found in the above-described mechanical systems.

The channel-up or channel-down initiate commands may be derived from any convenient source. In most applications, the receiver would contain appropriate circuitry for both generation of initiate commands through remotely transmitted received and decoded signals and directly operated switches accessible on the receiver front panel. In either event any convenient source of channel-up or channel-down initiate command signals may be utilized in the novel combination set forth without departing from the spirit of the present invention.

What has been shown is a novel tuning drive system for use in a television receiver which provides increased flexibility of application using a relatively simple, inexpensive control circuit.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. For use in a television tuning system in which a tuner channel selector is rotatable between a plurality of positions each corresponding to a broadcast channel, a tuner drive system including a bidirectional electric motor, means mechanically coupling said motor to said channel selector, initiate means responsive to viewer commands initiating channel selector rotation in a selected direction, carryover means activated by channel selector rotation for continuing said rotation in the selected direction until the next broadcast channel position is reached inactivating said carryover means, and skip means, mechanically coupled to said channel selector operative before said carryover means become inactivated causing said channel selector to pass through selected ones of said plurality of broadcast channel positions without stopping, said skip means comprising:
    a single pole switch;
    a plurality of camming means associated with each of said broadcast channel positions selectively positionable to engage said switch; and
    electrical latching means, responsive to said initiate means and said switch, maintaining channel selector rotation in the selected direction during the inactive period of said carryover means.

2. A tuner drive system as set forth in claim 1, wherein said skip means include:
    a bistable circuit defining first and second mutually exclusive output states; and
    first and second relays having first and second energizing windings coupled to said bistable circuit, said first relay energized by said first output state and causing said motor to rotate in a first direction and said second relay energized by said second output state and causing said motor to rotate in a second direction.

3. A tuner drive system as set forth in claim 2, wherein said bistable circuit includes first and second transistors coupled to said first and second energizing windings, respectively.

4. A tuner drive system as set forth in claim 3, including a source of operating voltage and wherein said operating voltage is coupled to said bistable circuit via said single pole switch.

5. A tuner drive system as set forth in claim 4, wherein said carryover means include a carryover cam coupled to said motor and a carryover switch coupling said source of operating potential to said bistable circuit, said carryover cam closing said carryover switch upon initial motor rotation and maintaining closure until the next channel position is reached.

6. A tuner drive system as set forth in claim 5, wherein said plurality of camming means close said single pole switch before the opening of said carryover switch and maintain closure until after said carryover switch again closes for channel positions programmed to be skipped.

* * * * *